United States Patent [19]
Guidash

[11] Patent Number: 5,881,184
[45] Date of Patent: Mar. 9, 1999

[54] ACTIVE PIXEL SENSOR WITH SINGLE PIXEL RESET

[75] Inventor: Robert M. Guidash, Rush, N.Y.

[73] Assignee: Eastman Kodak Company, Rochester, N.Y.

[21] Appl. No.: 821,550

[22] Filed: Mar. 21, 1997

Related U.S. Application Data

[60] Provisional application No. 60/018,085 May 22, 1996.

[51] Int. Cl.$^6$ ........................................................ G06K 9/00
[52] U.S. Cl. ............................................ 382/321; 382/317
[58] Field of Search ................................... 348/302, 308, 348/304, 241, 297, 299, 294, 300; 250/208.1, 214.1; 257/291, 292, 290, 448, 239, 369; 377/60; 382/312, 316, 317, 318, 319, 321, 322, 323, 324

[56] References Cited

U.S. PATENT DOCUMENTS

| | | | |
|---|---|---|---|
| 5,345,266 | 9/1994 | Denyer | 348/302 |
| 5,471,515 | 11/1995 | Fossum et al. | 377/60 |
| 5,572,257 | 11/1996 | Conrads et al. | 348/304 |
| 5,576,763 | 11/1996 | Ackland et al. | 348/308 |
| 5,614,744 | 3/1997 | Merrill | 257/291 |
| 5,631,704 | 5/1997 | Dickinson et al. | 348/308 |
| 5,708,263 | 1/1998 | Wong | 250/208.1 |

FOREIGN PATENT DOCUMENTS

| | | | |
|---|---|---|---|
| 0 708 554 A2 | 4/1996 | European Pat. Off. | H04N 3/15 |

OTHER PUBLICATIONS

"Design of a Low–Light–Level Image Sensor with On–Chip Sigma–Delta Analog–to–Digital Conversion" by Sunctra K. Mendis, Bedabrata Pain, Robert H. Nixon, Eric R. Fossum. SPIE vol. 1900/33,–(Jul. 1993)—(pp. 31–39)–.

Hon–Sum Wong, "Technology And Device Scaling Considerations for CMOS Imagers". IEEE Solid State Circuits Technology Workshop on CMOS Imaging Technology, Feb. 7, 1996, San Francisco, CA (pp.: 2131–2142).

E. Fossum, "Active Pixel Sensors: Are CCD's Dinosaurs?", SPIE vol. 1900–08–8194–1133 (pp.: 2–14) (Jul. 1993) (No Place of Publ.).

R.H. Nixon, S.E. Kemeny, C.O. Staller, and E.R. Fossum, "128 × 128 CMOS Photodiode–type Active Pixel Sensor With On–Chip Timing, Control and Signal Chain Electronics". Proceedings of the SPIE vol. 2415, Charge–Coupled Devices and Solid–State Optical Sensors V. paper 34 (1995) (pp.: 1–7).

"Image Sensors With Individual Pixel Reset" NASA Tech Briefs, Nov., 1996), p. 34 (By Yadidpecht et al.).

B.C. Burkey, W.C. Chang, J. Littlehale, T.H. Lee, T.J. Tredwell, J.P. Lavine, E.A. Trabka "The Pinned Photodiode For An Interline–Transfer CCD Image Sensor" 1984 IEDM, pp. 28–31.

J.E. D. Hurwitz, Peter B. Denyer, Donald J. bAxter, Graham Townsend, "An 800K Pixel Color CMOS Sensor For Consumer Still Cameras" VLSI Vision Ltd., Aviation house, 31 Pinkill, Edinburgh (No Page Number)(No Date).

Elji Oba, Keiji Mabuchi, Yoshinora Lida, Noburo Nakamura, Hiroki Miura "A 1/4 inch 300K Square Pixel Progressive Scan CMOS Active Pixel Image Sensor," 1997 IEEE International Solid–State Circuits Conference, pp. 180–189 and 452–454.

*Primary Examiner*—Leo H. Boudreau
*Assistant Examiner*—Bijan Tadayon
*Attorney, Agent, or Firm*—James D. Leimbach

[57] ABSTRACT

An active pixel image sensing device that provides uniform integration periods and either independent pixel reset, row, pixel reset, or column pixel reset, having a plurality of photodetector elements arranged in a matrix of rows and columns, each of the photodetectors having a transfer gate operatively connecting the photodetectors to a floating diffusion and further including a reset and clamp and sample function. A reset transistor for each row of photodetectors having a gate that can have a predetermined voltage applied to reset each row, and a column reset transistor for each column of photodetectors having a gate that can have a predetermined voltage applied to reset each column. This allows for uniform integration periods and a signal sample and clamp circuit for the entire array of photodetectors.

16 Claims, 1 Drawing Sheet

ACTIVE PIXEL SENSOR WITH SINGLE PIXEL RESET

FIELD OF THE INVENTION

This is related to provisional application number 60/018,085, filed May 22, 1996.

The invention relates generally to the field of solid state image sensors, and specifically, the invention relates to active pixel sensors.

BACKGROUND OF THE INVENTION

APS are solid state imagers where each pixel contains a photo-sensing means, charge to voltage conversion means, reset means, and all or part of an amplifier. They have some advantages over charge coupled device imagers (CCD), including single 5V supply operation, x-y addressability, and on-chip signal processing.

APS are solid state imagers where each pixel contains a photo-sensing means, charge to voltage conversion means, reset means and all or part of an amplifier. Because of the approach used in resetting the pixel, APS devices have been operated in a manner where each line or row of the imager is integrated, reset, and read out at a different time interval than each of the remaining lines or rows. Hence if one were reading out the entire imager, each line would have captured the scene at a different point in time. Since illumination conditions can and do vary temporally, and since objects in the scene may also be moving, this method of read out can produce line artifacts in the resulting representation of the imager. This limits the usefulness of APS devices in applications where high quality motion or still images are required.

Additionally, this method of operation (reset and read a row at a time), requires that each column of the device have a separate clamp and sample amplifier. It is often the physical size of this amplifier as realized in the process used to fabricate the device that limits the pixel size of the sensor. In order to build high resolution, small pixel APS devices, it is necessary to use sub-$\mu$m CMOS processes to realize the same resolution and sensitivity APS device when compared to a standard charge coupled device (CCD) sensor. The minimum pixel size of an APS device is typically 15× to 20× of the minimum feature size of the process technology used, compared to 5× to 10× for a CCD device.

From the foregoing discussion, it should be apparent that there remains a need within the art of APS devices for the provision of a reset mechanism that provides the capability to reset all pixels simultaneously as well as for selectively providing reset of a pixel at a time. Additionally, there remains a need in the art for a circuit design that will provide simultaneous and equal integration times of each pixel and enable use of a single clamp and sample amplifier per device rather than per column.

SUMMARY OF THE INVENTION

The present invention relates to the field of solid state photo-sensors and imagers, specifically imagers referred to as active pixel sensors (APS). It consists of a new pixel architecture and reset method that provides the ability to reset the device entirely, a row at a time, or any individual pixel separately.

A prior APS pixel is shown in FIG. 1. Pixels are arranged in an array (X-columns and Y-rows), to form an image sensor. Incident light creates electrons in the photodetector. These electrons are transferred onto the floating diffusion which is connected to the gate of SIG. This signal is read out by selecting the desired row (turning on the desired Row Select Signal by application of a "on-voltage" to the gate of Row Select Transistor), and then selecting each column separately. This signal level is stored on a capacitor in a clamp and sample circuit at the bottom of each column. The floating diffusion is then reset by turning on the Reset for that row, by applying the appropriate on-voltage to Reset Gate. That reset level is then stored on a separate capacitor in the clamp and sample amplifier, and differenced with signal level, providing offset cancellation for each pixel. This entire operation is then repeated for the remaining rows, with each row having the same integration time.

The present invention provides a reset mechanism that has the capability to reset all pixels simultaneously, or a single pixel at a time. This mechanism also provides simultaneous and equal integration times for each pixel. Furthermore, the reset mechanism of the present invention allows the use of a single clamp and sample amplifier per device rather than requiring a separate clamp and sample device for every column. Two physical embodiments of the new pixel architectures are shown in FIGS. 2A and 2B. Other specific physical embodiments are realizable. These two are chosen for illustration.

In the first architecture (shown in FIG. 2A), the pixel comprises an additional reset transistor with a Column Reset Gate. The original Reset Gate in FIG. 1 is a Row Reset Gate in the present invention as seen in FIG. 2A. It has an additional reset transistor when compared to the prior art pixel. In this architecture, both the Row Reset Gate and the Column Reset Gate must have an on-voltage applied to them in order to reset the pixel. Frame reset is accomplished by applying this on signal to each Row Reset Gate and Column Reset Gate simultaneously. Pixel by pixel reset is accomplished by using the column read signal as the Column Reset Gate signal, and applying the Row Reset Gate on-signal after the signal level of the pixel has been read. Now, since the reset signal for that pixel is available immediately after reading the signal level, without resetting the other pixels in that row, a single clamp and sample amplifier can be used. Additionally, frame integration has been accomplished.

In FIG. 2B another architecture is shown where the Row Reset Gate signal is applied to the drain of the Reset Transistor, and the Column Reset Gate signal is applied to the gate of the Reset Transistor. Operation is the same as that described above, except that one transistor is used instead of two, and will take up less area than the architecture in FIG. 1A. If separate digital and analog VDD busses are used for the prior art pixel, the architecture of FIG. 2B will have the same number of transistors and busses as the prior art pixel, so there is no sacrifice of fill factor to attain the pixel by pixel reset.

These and other aspects, objects, features, and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the following advantages: a reset means is provided giving the capability to reset all pixels simultaneously as well as a pixel at a time. This enables simultaneous and equal integration times for each pixel and enables the use of a single clamp and sample amplifier per device rather than per column.

BRIEF DESCRIPTION OF THE DRAWINGS

To facilitate understanding, identical reference numerals have been used, where possible, to designate identical elements that are common to the figures.

DETAILED DESCRIPTION OF THE INVENTION

This invention relates to the field of solid state photo-sensors and imagers, specifically imagers referred to as active pixel sensors (APS). It consists of a new pixel architecture and reset method that provides the ability to reset the device entirely, a row at a time, or any individual pixel separately.

Figure 1:
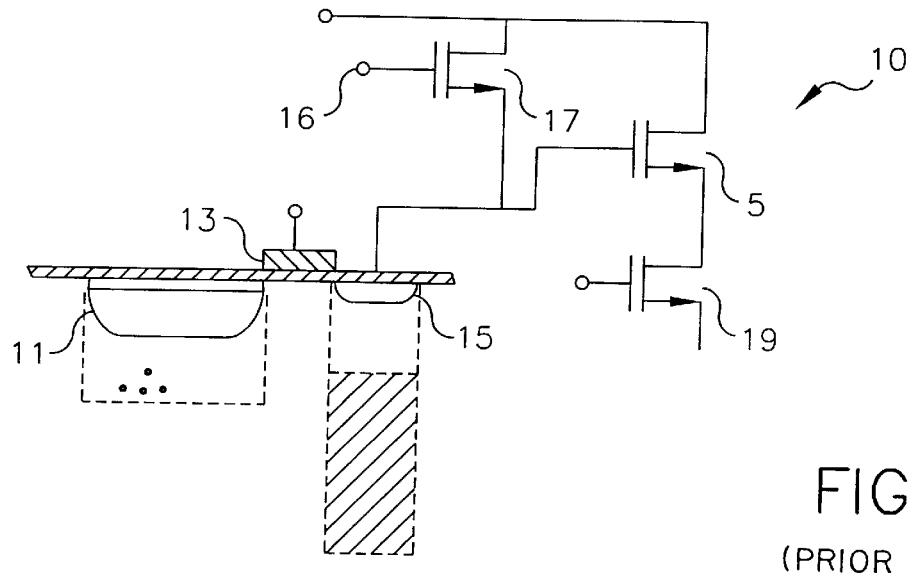
FIG. 1 is a diagram of a prior art active pixel sensor.

A prior APS pixel 10 is shown in FIG. 1. The pixel 10 comprises a photodetector 11, that can be either a photodiode or photogate, a transfer gate 13, floating diffusion 15, reset transistor 17, with a Reset Gate 16, Row Select Transistor 19, with a Row Select Gate, and Signal Transistor 5. Pixels, such as those shown in FIG. 1, are arranged in an array (X-columns and Y-rows), to form an image sensor. Operation of this device is done in a manner where incident light creates electrons in the photodetector. These electrons are then transferred onto the floating diffusion for the desired row by turning on Transfer Gate 13 for that row. This signal is read out by selecting the desired row and by turning on the desired row select transistor by application of a "on-voltage" to the gate for that Row Select Transistor 19. Each row for every column within the matrix is selected separately in this manner. All other rows are "turned-off" by applying the appropriate signal to the gate of the respective row select transistor for those rows. Hence when selecting a specific column (the details of this operation are not relevant to this invention), the signal present on that line will be determined by which row is selected (i.e. the row in which row select transistor is turned on). This signal level is stored on a capacitor in a clamp and sample circuit at the bottom of each column. After the signal level has been stored, the floating diffusion 15 is then reset by applying the appropriate on-voltage to Reset Gate 16 of the respective Reset Transistor 17. Every pixel in that row is now reset. That reset level is then stored on a separate capacitor in the clamp and sample amplifier, and differenced with signal level, providing offset cancellation for each pixel. This entire operation is then repeated for the remaining rows. Each row has the same integration time (time elapsed between reset and transfer) but is integrated at a different point in time than each of the other rows.

Figure 2A:
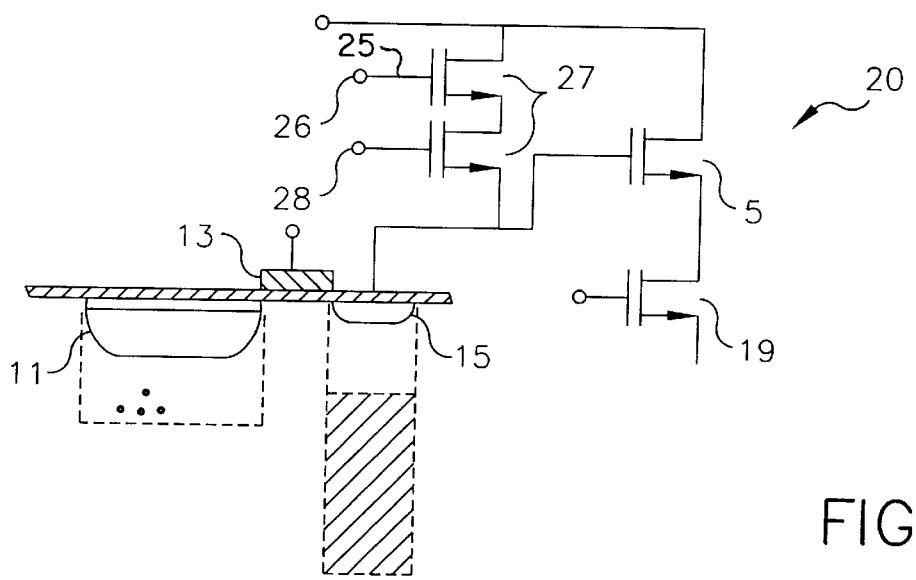
FIG. 2A is a diagram of an active pixel sensor employing the single pixel reset of the present invention.
Figure 2B:
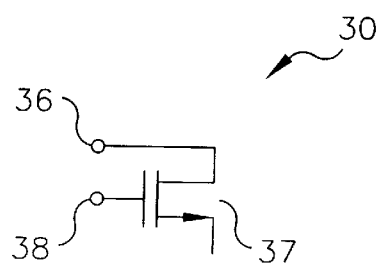
FIG. 2B is an alternative embodiment of the invention.

The present invention provides a reset means that provides the capability to reset all pixels simultaneously as well as the capability to reset one pixel at a time. The ability to reset all pixels at one time enables simultaneous and equal integration times for each pixel and enables the use of a single clamp and sample amplifier per device rather than per column. Two physical embodiments of the new pixel architectures are shown in FIGS. 2A and 2B. Other specific physical embodiments are realizable. These two are chosen for illustration.

Referring to FIG. 2A, a first architecture of an active pixel sensor 20 as envisioned by the present invention is illustrated comprising the photodetector 11, transfer gate 13 and floating diffusion 15 as shown in FIG. 1 and further comprising an additional reset transistor with a column reset gate 28. The original Reset Transistor 17 from the prior art device shown in FIG. 1 is used as a Row Reset Transistor 27 in the present invention as shown in FIG. 2A having Row Reset Gate 26. The embodiment shown has a single Row Reset Transistor 27, with one Row Reset Gate 26, and the associated Row Reset Gate Buss 25 for every row and one Column Reset Gate 28 with a corresponding buss for every column. Therefore, there is an additional reset transistor within the embodiment as shown in FIG. 2A compared to the prior art pixel previously discussed.

The architecture shown in FIG. 2A requires that both Row Reset Gate 26 and Column Reset Gate 28 have an on-voltage applied to them in order to reset the pixel. Frame reset is accomplished by applying this on-voltage signal to both Row Reset Gate 26 and Column Reset Gate 28 simultaneously. Each pixel is then integrated for a pre-determined period of time and the signal electrons are then transferred to and stored on the floating diffusion. Read out is accomplished by selecting the desired row to be read out (i.e. turning on the appropriate row select 19), and then selecting the column to be read. The column select signal is used as the Column Reset Gate on-signal. The signal level is stored on a capacitor in a clamp and sample amplifier that is at the bottom of the device. The column being read is multiplexed to the input of this amplifier. After the column signal has been read and the column select signal is still present, the Row Reset Gate 26 is turned on and the pixel is reset. This reset level is then stored on another capacitor in the clamp and sample amplifier and differenced with the signal level. This same sequence then occurs with the rest of the columns in that row, since none of the other pixels have been reset yet. This pixel by pixel reset is accomplished by Column Reset Gate signal being the column read signal and then applying the Row Reset Gate on-signal after the signal level of the pixel has been read.

Since the reset signal for that pixel is available immediately after reading the signal level, without resetting the other pixels in that row, a single clamp and sample amplifier can be used. Additionally frame integration has been accomplished.

FIG. 2B shows a second preferred architecture where the Active Pixel Sensor (APS) 30 has Row Reset Gate signal 36 applied to the drain of the reset transistor 37, and the Column Reset Gate signal 38 is applied to the gate of the reset transistor 37. Operation is the same as that described above for FIG. 2B, except that one transistor is used instead of two, and will take up less area than the architecture in FIG. 1. If separate digital and analog VDD busses are used for the prior art pixel, the architecture of FIG. 2B maintains the fill factor of the prior art pixel while providing added capability.

The invention has been described with reference to a preferred embodiment. However, it will be appreciated that variations and modifications can be effected by a person of ordinary skill in the art without departing from the scope of the invention.

Parts List 5 signal transistor
10 prior art device
11 photodetector
13 transfer gate
15 floating diffusion
16 reset gate
17 reset transistor
19 row select transistor 20 active pixel sensor (APS)
25 row reset gate buss
26 row reset gate
27 reset transistor
28 column reset gate
30 second preferred embodiment APS
36 row reset gate
37 reset transistor
38 column reset gate

What is claimed is:

1. An active pixel image sensing device having a plurality of photodetector elements arranged in a matrix of rows and columns, each of the photodetectors having a transfer gate operatively connecting the photodetectors to a floating diffusion and a row reset signal that can be applied to reset the floating diffusion for each row, the improvement comprising:

a reset transistor operatively connected to a column reset signal that can be applied in conjunction with the row control signal to reset any individual floating diffusion in a given row.

2. The pixel of claim 1 wherein the reset transistor is part of a reset circuit, the reset circuit has the column reset signal as an input.

3. The pixel of claim 1 wherein the reset circuit further comprises a pair of transistors having a column reset transistor placed in a series with a row reset transistor.

4. The pixel of claim 1 wherein the reset circuit further comprises a single transistor having row and column reset signals to reset the pixel.

5. The pixel of claim 4 further comprising means for antiblooming.

6. The pixel of claim 5 wherein the means for antiblooming further comprises means for controlling antiblooming independent of the column reset signal.

7. The pixel of claim 5 wherein the means for antiblooming further comprises the row select signal is connected to the drain of the reset transistor.

8. The pixel of claim 4 wherein the row select signal is connected to the drain of the reset transistor and the column reset signal is connected to the gate of the reset signal.

9. A method of making an active pixel image sensing device having a plurality of photodetector elements arranged in a matrix of rows and columns, each of the photodetectors having a transfer gate operatively connecting the photodetectors to a floating diffusion and a row reset signal that can be applied to reset the floating diffusion for each row, the improvement comprising the steps of:

providing a reset transistor that is operatively connected to a column reset signal that can be applied in conjunction with the row control signal to reset any individual floating diffusion in a given row.

10. The method of claim 9 wherein the step of providing the reset transistor further comprises providing the reset transistor as part of a reset circuit, the reset circuit has the column reset signal as an input.

11. The method of claim 10 wherein the step of providing the reset circuit further comprises providing a pair of transistors having a column reset transistor placed in series with a row reset transistor.

12. The method of claim 10 wherein the step of providing the reset circuit further comprises providing a single transistor having row and column reset signals to reset the pixel.

13. The method of claim 12 wherein the step of providing the single transistor further comprises providing an antiblooming circuit.

14. The method of claim 13 wherein the step of providing an antiblooming circuit further comprises providing for an antiblooming controlling mechanism independent of the column reset signal.

15. The method of claim 13 wherein the step of providing an antiblooming circuit further comprises providing a row select signal connected to the drain of the reset transistor.

16. The method of claim 12 wherein the step of providing further comprises providing a row select signal that is connected to the drain of the reset transistor and the column reset signal is connected to the gate of the reset signal.

* * * * *